United States Patent
Ohi et al.

(10) Patent No.: US 11,049,941 B2
(45) Date of Patent: Jun. 29, 2021

(54) SEMICONDUCTOR DEVICE

(71) Applicant: FUJI ELECTRIC CO., LTD., Kanagawa (JP)

(72) Inventors: Kota Ohi, Matsumoto (JP); Yuichi Onozawa, Matsumoto (JP); Yoshihiro Ikura, Matsumoto (JP)

(73) Assignee: FUJI ELECTRIC CO., LTD., Kanagawa (JP)

( * ) Notice: Subject to any disclaimer, the term of this patent is extended or adjusted under 35 U.S.C. 154(b) by 41 days.

(21) Appl. No.: 16/143,461

(22) Filed: Sep. 27, 2018

(65) Prior Publication Data

US 2019/0027561 A1 Jan. 24, 2019

Related U.S. Application Data

(63) Continuation of application No. PCT/JP2017/037428, filed on Oct. 16, 2017.

(30) Foreign Application Priority Data

Oct. 17, 2016 (JP) .............................. JP2016-203599

(51) Int. Cl.
*H01L 29/10* (2006.01)
*H01L 29/08* (2006.01)
(Continued)

(52) U.S. Cl.
CPC ...... *H01L 29/1095* (2013.01); *H01L 29/0821* (2013.01); *H01L 29/12* (2013.01);
(Continued)

(58) Field of Classification Search
None
See application file for complete search history.

(56) References Cited

U.S. PATENT DOCUMENTS 7,317,252 B2 1/2008 Mauder
10,068,998 B2 9/2018 Nemoto
(Continued)

FOREIGN PATENT DOCUMENTS

CN 101494223 A 7/2009
CN 102738238 A 10/2012
(Continued)

OTHER PUBLICATIONS

International Search Report for International Patent Application No. PCT/JP20171037428, issued by the Japan Patent Office dated Jan. 9, 2018.
(Continued)

*Primary Examiner* — Steven M Christopher

(57) ABSTRACT

A semiconductor device is provided comprising: a semiconductor substrate; a drift region having a first conductivity type formed in the semiconductor substrate; a collector region having a second conductivity type, in the semiconductor substrate, formed between the lower surface of the semiconductor substrate and the drift region; and a high concentration region having a first conductivity type, in the semiconductor substrate, formed between the drift region and the collector region and having higher doping concentration than that in the drift region, wherein a doping concentration distribution of the high concentration region in the depth direction of the semiconductor substrate comprises one or more peaks, wherein a distance between a first peak closest to the lower surface side of the semiconductor substrate among the peaks of the doping concentration distribution of the high concentration region and the lower surface of the semiconductor substrate is 3 μm or less.

19 Claims, 9 Drawing Sheets

(51) Int. Cl.
*H01L 29/739* (2006.01)
*H01L 29/12* (2006.01)
*H01L 29/861* (2006.01)

(52) U.S. Cl.
CPC ........ *H01L 29/739* (2013.01); *H01L 29/7397* (2013.01); *H01L 29/8613* (2013.01)

(56) References Cited

U.S. PATENT DOCUMENTS

| | | |
|---|---|---|
| 10,418,441 B2 | 9/2019 | Naito |
| 2008/0001257 A1 | 1/2008 | Schulze |
| 2009/0184340 A1* | 7/2009 | Nemoto ............ H01L 29/7397 257/139 |
| 2010/0148215 A1 | 6/2010 | Schulze |
| 2012/0261715 A1 | 10/2012 | Kim |
| 2012/0267681 A1* | 10/2012 | Nemoto ............... H01L 29/861 257/139 |
| 2014/0217463 A1 | 8/2014 | Schulze |
| 2014/0246755 A1 | 9/2014 | Yoshimura et al. |
| 2014/0319578 A1 | 10/2014 | Huesken |
| 2016/0111528 A1 | 4/2016 | Schulze |
| 2016/0197143 A1* | 7/2016 | Naito ................ H01L 21/26513 257/334 |
| 2016/0284803 A1 | 9/2016 | Baburske |
| 2017/0018434 A1 | 1/2017 | Onozawa |
| 2017/0025410 A1* | 1/2017 | Cheng ................ H01L 27/0727 |
| 2019/0148500 A1* | 5/2019 | Agata .................... H01L 29/36 257/655 |

FOREIGN PATENT DOCUMENTS

| | | |
|---|---|---|
| CN | 105531825 A | 4/2016 |
| JP | 2002246597 A | 8/2002 |
| JP | 2006049933 A | 2/2006 |
| JP | 2009176892 A | 8/2009 |
| WO | 2013100155 A1 | 7/2013 |
| WO | 2015093190 A1 | 6/2015 |
| WO | 2016051970 A1 | 4/2016 |

OTHER PUBLICATIONS

Notice of First Office Action for Patent Application No. 201780019961.9, issued by The National Intellectual Property Administration of the People's Republic of China dated Dec. 15, 2020.

* cited by examiner

SEMICONDUCTOR DEVICE

The contents of the following Japanese patent applications are incorporated herein by reference:
NO. 2016-203599 filed in JP on Oct. 17, 2016, and
NO. PCT/JP2017/037428 filed on Oct. 16, 2017.

BACKGROUND

1. Technical Field

The present invention relates to a semiconductor device.

2. Related Art

In the semiconductor device such as IGBTs (Insulated Gate Bipolar Transistors), a structure is known to form a field stop layer on the back surface side of a semiconductor substrate (for example, see the Patent document 1).
Patent document 1: WO2013/100155
The semiconductor device such as the IGBTs preferably has a large withstand capability.

SUMMARY

In one aspect of the present invention, a semiconductor device with a semiconductor substrate is provided. The semiconductor device may include a drift region having a first conductivity type formed in the semiconductor substrate. In the semiconductor substrate, the semiconductor device may include a collector region having a second conductivity type formed between the lower surface of the semiconductor substrate and the drift region. The semiconductor device may include a high concentration region having the first conductivity type formed between the drift region and the collector region in the semiconductor substrate, and having a higher doping concentration than that in the drift region. The doping concentration distribution of the high concentration region in the depth direction of the semiconductor substrate may have one or more peaks. The distance between a first peak closest to the lower surface side of the semiconductor substrate among the peaks in the doping concentration distribution of the high concentration region and the lower surface of the semiconductor substrate may be 3 μm or less.

An integrated concentration value obtained by integrating the doping concentration of the high concentration region across the depth direction of the high concentration region may be greater than or equal to a critical integrated concentration. The distance between the first peak and the lower surface of the semiconductor substrate may be 2 μm or less. The doping concentration of the first peak may be $1.0 \times 10^{16}$/cm$^3$ or less. The doping concentration of the first peak may be $6.7 \times 10^{15}$/cm$^3$ or less. The doping concentration of the collector region may be $1.0 \times 10^{18}$/cm$^3$ or less. The doping concentration of the collector region may be $5.0 \times 10^{17}$/cm$^3$ or less. The distance from a boundary position between the collector region and the first peak in the depth direction to the lower surface of the semiconductor substrate may be 0.5 μm or more and 1.0 μm or less.

The doping concentration of the collector region $C_p$ (/cm$^3$), the doping concentration of the first peak $C_{fs1}$ (/cm$^3$), and the depth position of the first peak $D_{fs1}$ (μm) may satisfy the following equation. $D_{fs1} < -2.0 \times 10^{-16} \times C_{fs1} + b$, where $b = 4.0 \times 10^{-18} \times C_p + 2.9$.

The semiconductor device may further include a base region having a second conductivity type in the semiconductor substrate formed between the drift region and the upper surface of the semiconductor substrate. The doping concentration distribution in the high concentration region may have a plurality of peaks. A position at which the integrated concentration obtained by integrating, from a first p-n junction between the base region and the drift region toward a second p-n junction between the high concentration region and the collector region, the doping concentration of the drift region and high concentration region reaches 0.6 times of the critical integrated concentration may be located between the first peak closest to the lower surface side of the semiconductor substrate among peaks in the high concentration region and the second peak adjacent to the first peak.

A position at which the integrated concentration reaches a critical integrated concentration may be in a region between a position that is on the lower side from the first peak position of the high concentration region by the full width at half maximum of the mountain-shaped doping concentration distribution including the first peak and a position that is on the upper side from the first peak position of the high concentration region by the full width at half maximum.

A space charge region may have been formed over a region having a mountain-shaped doping concentration distribution including the second peak in at least the drift region and the high concentration region. The semiconductor device may include a source region having the first conductivity type formed between the base region and the upper surface of the semiconductor substrate. The semiconductor device may include a trench MOS gate extending from the upper surface of the semiconductor substrate through the source region and the base region to the drift region. The current gain $\alpha_{PNP}$ may be greater than, $$1 - \cfrac{1}{1 + v_{sat,p}\left(\cfrac{1}{v_{sat,n}} - \cfrac{qN_D}{J_{sat,n}}\right)} \qquad \text{[Equation 8]}$$

with respect to the electron saturation velocity $v_{sat,n}$ and the hole saturation velocity $v_{sat,p}$, as well as the saturation current density of the trench MOS gate $J_{sat,n}$ and the doping concentration of the drift region $N_D$.

The current gain $\alpha_{PNP}$ may be greater than, $$1 - \cfrac{1}{1 + \cfrac{v_{sat,p}}{v_{sat,n}}} \qquad \text{[Equation 81B]}$$

with respect to an electron saturation velocity $v_{sat,n}$ and a hole saturation velocity $v_{sat,p}$.

The saturation current density of the trench MOS gate $J_{sat,n}$ is represented as, $$J_{sat,n} = \left(\frac{\mu_n C_{ox}}{2L_{CH}}\right)(V_G - V_T)^2 f_A \qquad \text{[Equation 8C]}$$

where $\mu_n$ is the electron mobility in an inversion layer channel, $C_{ox}$ is the capacitance of the MOS gate, $L_{CH}$ is the inversion layer channel width, $V_G$ is the gate voltage, $V_T$ is the gate threshold, and $f_A$ is the number of unit cells, including one inversion layer channel, per 1 cm$^2$, wherein $f_A$ may be 5E7 or less.

The high concentration region may include hydrogen donors. The integrated concentration from the position of the first peak to the position of the p-n junction between the high concentration region and the collector region may be less than or equal to the critical integrated concentration. The semiconductor device may be provided between the base region and the drift region, and may include an accumulation region having the first conductivity type with a higher doping concentration than that in the drift region. The length from the upper end of the base region to the upper end of the accumulation region in the depth direction of the semiconductor substrate may be longer than the differential length $D_{fs1}-D_b$, the distance being $D_{fs1}$ from the lower surface of the semiconductor substrate to the first peak and the distance being $D_b$ from the lower surface of the semiconductor substrate to the position of p-n junction between the high concentration region and the collector region.

The above-described summary clause does not necessarily describe all necessary features of the embodiments of the present invention. The present invention may also be a sub-combination of the features described above.

DESCRIPTION OF EXEMPLARY EMBODIMENTS

Hereinafter, the present invention will be described through embodiments of the invention, but the following embodiments do not limit the invention according to the claims. In addition, all the combinations of the features described in the embodiments are not necessarily essential to means provided by aspects of the invention.

In this specification, one side in a direction parallel to the depth direction of a semiconductor substrate is referred to as the "upper" side, and the other side is referred to as the "lower" side. One surface of two principal surfaces of a substrate, a layer or some other member is referred to as the upper surface, and the other surface is referred to as the lower surface. The "upper" and "lower" directions are not limited to the gravitational direction.

An example where a first conductivity type is n type and a second conductivity type is p type is shown in each example embodiment, but the first conductivity type may be p type and the second conductivity type may be n type. In this case, conductivity types of a substrate, a layer, a region, and the like in each example respectively have opposite polarities. In addition, numerical values denoted as nEm in this specification, the claims, and drawings mean $n \times 10^m$.

In this specification and the like, the doping concentration refers to the concentration of donor or acceptor impurities. In this specification and the like, the concentration difference between donor and acceptor may be used as the doping concentration. In addition, the peak value of the doping concentration distribution in a doping region may be used as the doping concentration in the doping region.

Figure 1:
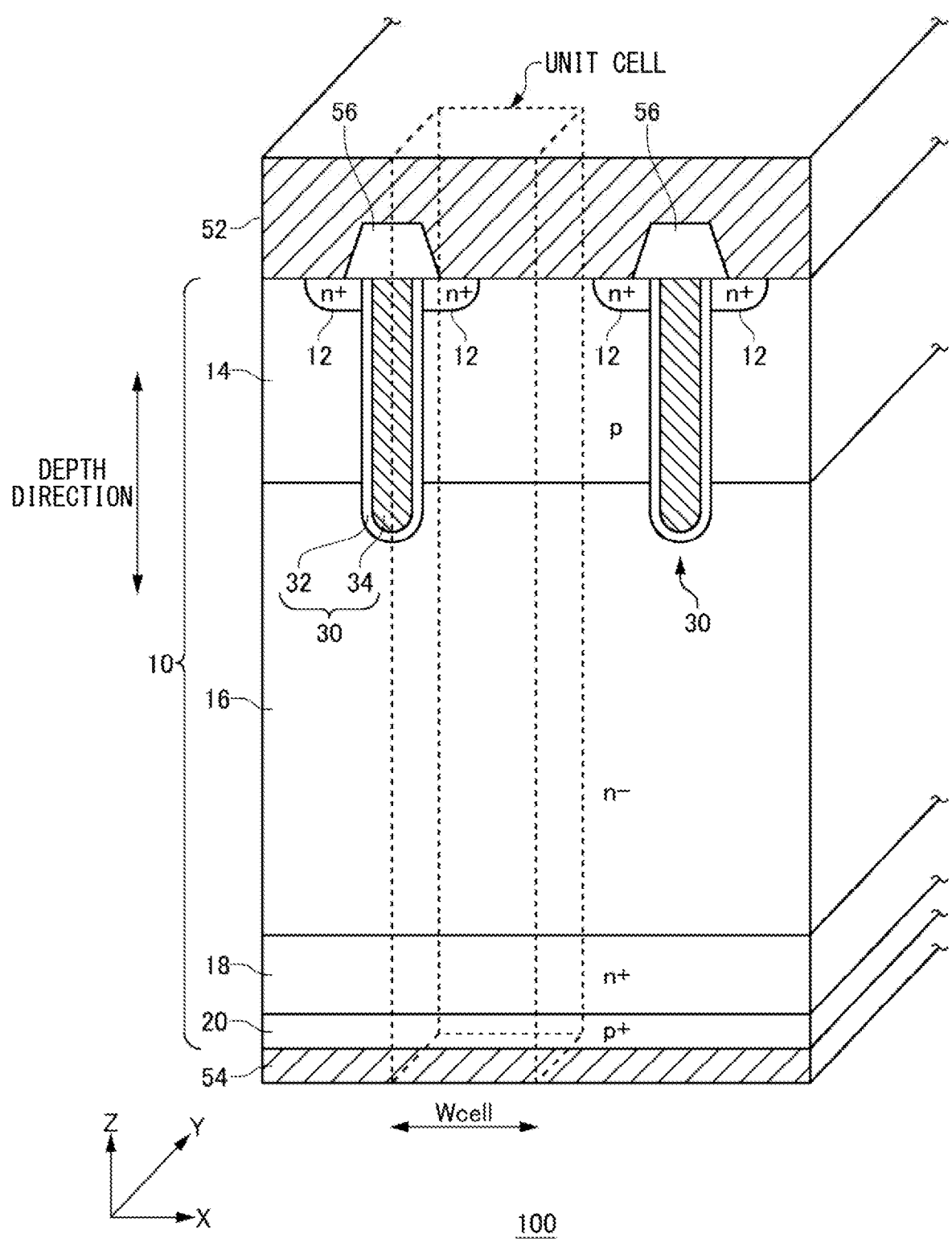
FIG. 1 is a cross-sectional perspective view of a semiconductor device 100 according to an embodiment of the present invention.

FIG. 1 is a cross-sectional perspective view of a semiconductor device 100 according to an embodiment of the present invention. The semiconductor device 100 is a vertical device that allows an electrical current to flow in the depth direction of a semiconductor substrate 10. The semiconductor device 100 may be a power semiconductor including the IGBT.

The semiconductor device 100 includes the semiconductor substrate 10, an emitter electrode 52, and a collector electrode 54. The emitter electrode 52 is formed on the upper surface of the semiconductor substrate 10. The collector electrode 54 is formed on the lower surface of the semiconductor substrate 10. In this example, the direction perpendicular to the upper surface and the lower surface of the semiconductor substrate 10 is referred to as the depth direction of the semiconductor substrate 10. Also, in FIG. 1, the depth direction is taken as the Z-axis direction. In the cross section shown in FIG. 1, the direction perpendicular to the Z-axis is taken as the X-axis. The direction perpendicular to the XZ-cross section is taken as the Y-axis. The emitter electrode 52 and the collector electrode 54 are formed of a metal material such as aluminum.

The semiconductor substrate 10 is formed of a semiconductor material such as silicon or compound semiconductors. The semiconductor substrate 10 is doped with impurities of a predetermined concentration. The semiconductor substrate 10 of this example has the n− type conductivity type.

Inside the semiconductor substrate 10, an n+ type source region 12, a p type base region 14, an n− type drift region 16, an n+ type buffer region 18, a p+ type collector region 20, and one or more gate trench portions 30 are formed.

The drift region 16 contains n type impurities such as phosphorous. As an example, the remaining region without forming other regions such as the source region 12, the base region 14, the buffer region 18, and the collector region 20 among the regions of the semiconductor substrate 10 serves as the drift region 16.

The base region 14 contains p type impurities such as boron. The base region 14 is formed above the drift region 16. The base region 14 of this example is formed in contact with the drift region 16. In another example, another region such as an n+ type accumulation region may be formed between the base region 14 and the drift region 16.

The source region 12 contains n type impurities such as phosphorous at a higher concentration than that in the drift region 16. The source region 12 is selectively formed on the upper surface of the base region 14. The base region 14 is disposed below the source region 12. On the upper surface of the semiconductor substrate 10, the source region 12 and the base region 14 are exposed. The gate trench portion 30 is formed extending from the upper surface of the semiconductor substrate 10 through the source region 12 and the base region 14. The lower end of the gate trench portion 30 is disposed in the drift region 16.

The gate trench portion 30 has a gate insulating film 32 formed on the inner wall of the trench and a gate metal layer 34 covered with the gate insulating film 32 in the trench. As an example, the gate insulating film 32 is an oxide film formed by oxidizing the inner wall of the trench. The gate metal layer 34 is formed of a conductive material such as poly-silicon doped with impurities, for example. The gate trench portion 30 is an example of the trench MOS gate.

The gate metal layer 34 is formed at least from a position opposed to the lower end of the source region 12 to a position opposed to the upper end of the drift region. In a portion of the base region 14, opposed to the gate metal layer 34, a channel is formed by applying a voltage higher than or equal to a threshold voltage to the gate metal layer 34.

Note that each portion of the electrodes, regions, and the like shown in FIG. 1 is formed extending in a direction perpendicular to the cross section shown in FIG. 1 (Y-axis direction). For example, each gate trench portion 30 has a stripe shape extending in a direction perpendicular to the cross section. Also, the source region 12 in the example of FIG. 1 is formed in a stripe shape extending in a direction perpendicular to the cross section, in parallel with the gate trench portion 30. In another example, the source region 12 and the base region 14 may be also provided to be exposed alternately on the upper surface of the semiconductor substrate 10 in a direction perpendicular to the cross section.

An interlayer dielectric film 56 is provided between the gate trench portion 30 and the emitter electrode 52. The interlayer dielectric film 56 is, for example, a silicate glass doped with boron, phosphorous, and the like. The interlayer dielectric film 56 is provided to expose at least a part of the source region 12 and the base region 14. Other parts of the source region 12 and the base region 14 that are not covered with the interlayer dielectric film 56 are electrically connected to the emitter electrode 52.

The collector region 20 contains p type impurities such as boron. The collector region 20 is formed between the lower surface of the semiconductor substrate 10 and the drift region 16. The collector region 20 of this example is exposed on the lower surface of the semiconductor substrate 10 and electrically connected to the collector electrode 54.

The buffer region 18 contains n type impurities such as hydrogen. The n type impurities in buffer region 18 may be hydrogen donors. The hydrogen donors are formed by ion implantation of hydrogen ions such as protons and thermal treatment. The doping concentration in the buffer region 18 is higher than the doping concentration in the drift region 16. The buffer region 18 is an example of a high concentration region formed between the drift region 16 and the collector region 20. Providing the buffer region 18 can prevent a depletion layer spreading from the boundary between the base region 14 and the drift region 16 from reaching the collector region 20. The buffer region 18 serves as a field stop layer.

When a load short-circuited state, in which the source voltage is applied directly between the emitter and the collector of the semiconductor device 100, occurs, a large amount of electrons are injected into the drift region 16 from the emitter side and positive charges of donors in the drift region 16 are canceled out by negative charges of electrons. As a result, the drift region 16 cannot accept any voltage, and an electric field concentrates in a narrow region of the collector side of semiconductor substrate 10, which may cause the back surface avalanche breakdown.

To prevent the back surface avalanche breakdown from occurring, it is conceivable to reduce an amount of electrons injected from the emitter side in the short-circuited state. However, when a threshold voltage is increased or a channel density is decreased to reduce the amount of electrons injected from the emitter side, a maximum current of the semiconductor device 100 is decreased and an on-voltage is increased.

As another method of preventing the back surface avalanche breakdown from occurring to increase the short circuit withstand capability, it is conceivable to increase an amount of holes injected from the collector side into the drift region 16. Thus, the negative charges of electrons injected from the emitter side in the short-circuited state can be canceled out by the positive charges of holes injected from the collector side.

The amount of holes injected from the collector side is increased by increasing the current amplification factor $\alpha_{PNP}$ of parasitic pnp transistors of the semiconductor device 100. The current amplification factor $\alpha_{PNP}$ is given by the following equation.

$$\alpha_{PNP} = \gamma_C \times \alpha_T \times \gamma_E$$

Note that $\gamma_C$ is the collector injection efficiency of the parasitic pnp transistors, $\alpha_T$ is the base transport factor of the parasitic pnp transistors, and $\gamma_E$ is the emitter injection efficiency of the parasitic pnp transistors. In the case of the IGBT in this example, the emitter injection efficiency $\gamma_E$ is an injection efficiency of hole currents injected from the collector region 20 to the buffer region 18.

The collector injection efficiency $\gamma_C$ of the parasitic pnp transistors is increased by increasing the doping concentration of the collector region 20. However, as the doping concentration of the collector region 20 is increased, the turn-off power loss is increased.

Thus, it is preferable to increase the base transport factor $\alpha_T$ of parasitic pnp transistors to increase the amount of holes injected from the collector side. In the semiconductor device 100, adjustment of the peak position of the doping concentration of the buffer region 18 increases the base transport factor arr.

Figure 2:
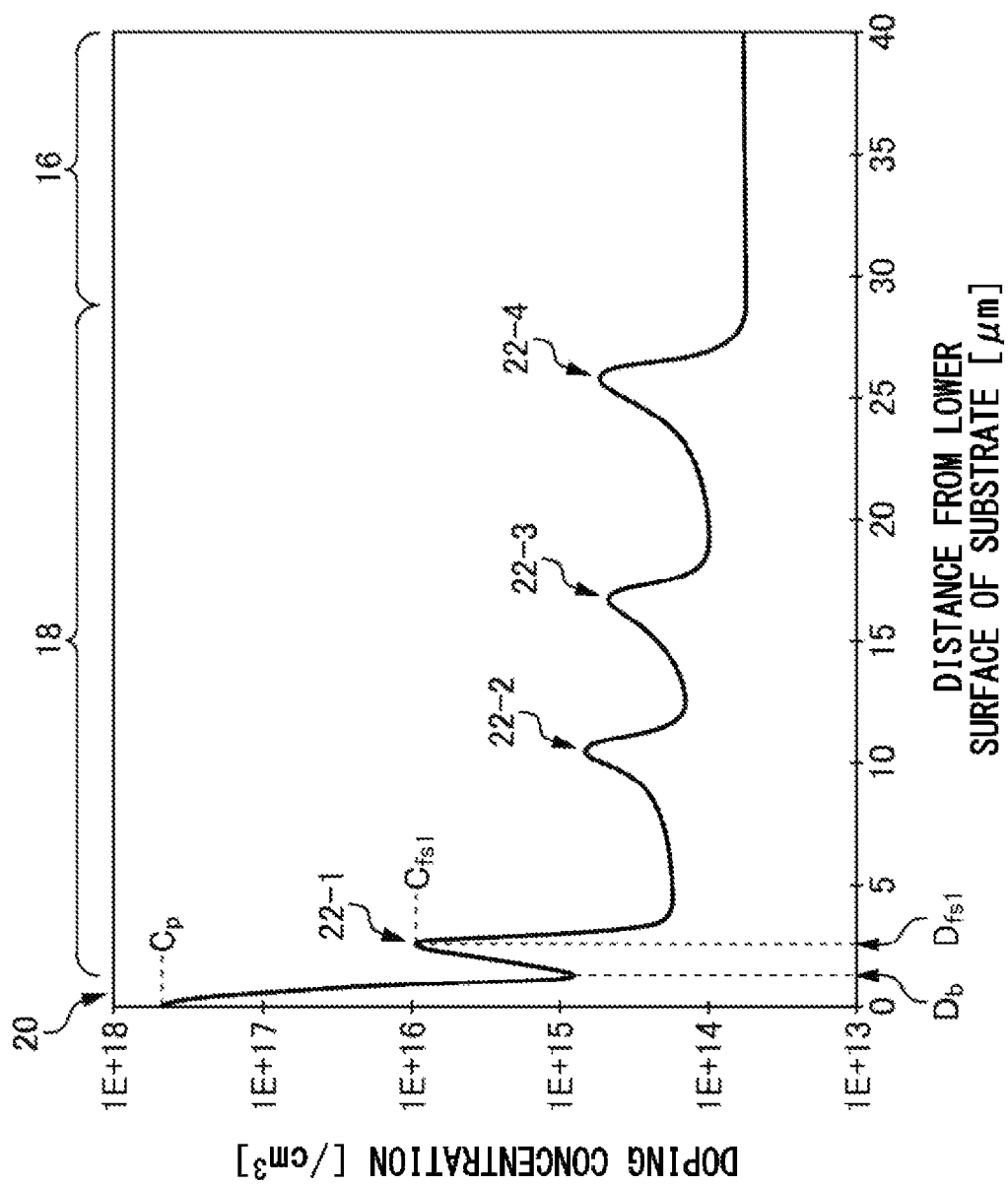
FIG. 2 is a diagram showing an example of a doping concentration distribution in the depth direction of the semiconductor substrate 10.

FIG. 2 is a diagram showing an example of a doping concentration distribution in the depth direction of the semiconductor substrate 10. FIG. 2 shows the doping concentration distribution of the collector region 20, buffer region 18, and a part of the drift region 16. In FIG. 2, the horizontal axis shows a distance from the lower surface of the semiconductor substrate 10, and the vertical axis shows the doping concentration per unit volume in a logarithmic scale.

The drift region 16 has an approximately constant doping concentration. The drift region 16 in this example includes n type impurities. The doping concentration distribution in the buffer region 18 has one or more peaks 22. The buffer region 18 in this example includes n type impurities. The buffer region 18 in this example has a first peak 22-1, a second peak 22-2, a third peak 22-3, and a fourth peak 22-4 in the order from the lower surface side of the semiconductor substrate 10.

Herein, when the position of the first peak 22-1, closest to the lower surface side of the semiconductor substrate 10 among the peaks 22 of the doping concentration in the buffer region 18, is moved close to the lower surface of the semiconductor substrate 10, the back surface avalanche withstand capability can be increased.

When the position of the first peak 22-1 is moved close to the lower surface of the semiconductor substrate 10, the distance between the first peak 22-1 and the peak position of the doping concentration of the collector region 20 is decreased. Some of holes injected from the collector region 20 recombine and disappear at the first peak 22-1, but the rate of holes passing through the first peak 22-1 can be increased by moving the first peak 22-1 close to the collector region 20. This can increase the base transport factor $\alpha_T$ of the parasitic pnp transistors and increase the back surface avalanche withstand capability.

In this example, the doping concentration at the first peak 22-1 is $C_{fs1}$, and the doping concentration in the collector region 20 is $C_p$. In addition, the distance between the lower surface of the semiconductor substrate 10 and the first peak 22-1 is $D_{fs1}$. Also, the distance from the boundary between the n type first peak 22-1 and the p type collector region 20 to the lower surface of the semiconductor substrate 10 is $D_b$. The position of the first peak 22-1 in the depth direction is a position at which the doping concentration shows the maximum value. The boundary position between the n type first peak 22-1 and p type collector region 20 is a position at which the doping concentration shows the minimum value.

In this example, the first peak 22-1, which is at the shallowest position when viewed from the lower surface of the semiconductor substrate 10, has a higher doping concentration than those of the other peaks 22. For example, the first peak 22-1 has a doping concentration 10 or more times higher than any of the other peaks 22. Also, the doping concentration $C_p$ of the collector region 20 is higher than the doping concentration $C_{fs1}$ of the first peak 22-1. For example, the doping concentration $C_p$ of the collector region 20 is 10 or more times higher than the doping concentration $C_{fs1}$ of the first peak 22-1.

The distance $D_{fs1}$ between the first peak 22-1 and the lower surface of the semiconductor substrate 10 is generally approximately 3.6 μm. In contrast, the distance $D_{fs1}$ in the semiconductor device 100 of this example is 3.0 μm or less. In this way, the shallow arrangement of the first peak 22-1 can lead to an effect of an improved the back surface avalanche withstand capability, compared with general semiconductor devices. The distance $D_{fs1}$ may be 2.5 μm or less, may be 2.0 μm or less, may be 1.5 μm or less, or may be 1.0 μm or less.

On the other hand, as the distance $D_{fs1}$ is decreased, the region in which the collector region 20 can be formed is smaller, so that the improvement of the injection efficiency of holes becomes difficult. Thus, the distance $D_b$ is preferably 0.5 μm or more to improve the hole injection efficiency from the collector region 20. The distance $D_b$ may be 1.0 μm or less. The distance $D_{fs1}$ may be 1.0 μm or more.

In this example, the position of the first peak 22-1 is defined with reference to the lower surface of the semiconductor substrate 10, but it may be also defined with reference to the peak position of the doping concentration distribution in the collector region 20, in another example. That is, the above-described distance $D_{fs1}$ may also be the distance between the peak of the doping concentration distribution in collector region 20 and the first peak 22-1. In this example, the position of the lower surface of the semiconductor substrate 10 is almost the same as the peak position of the doping concentration distribution in the collector region 20.

Figure 3:
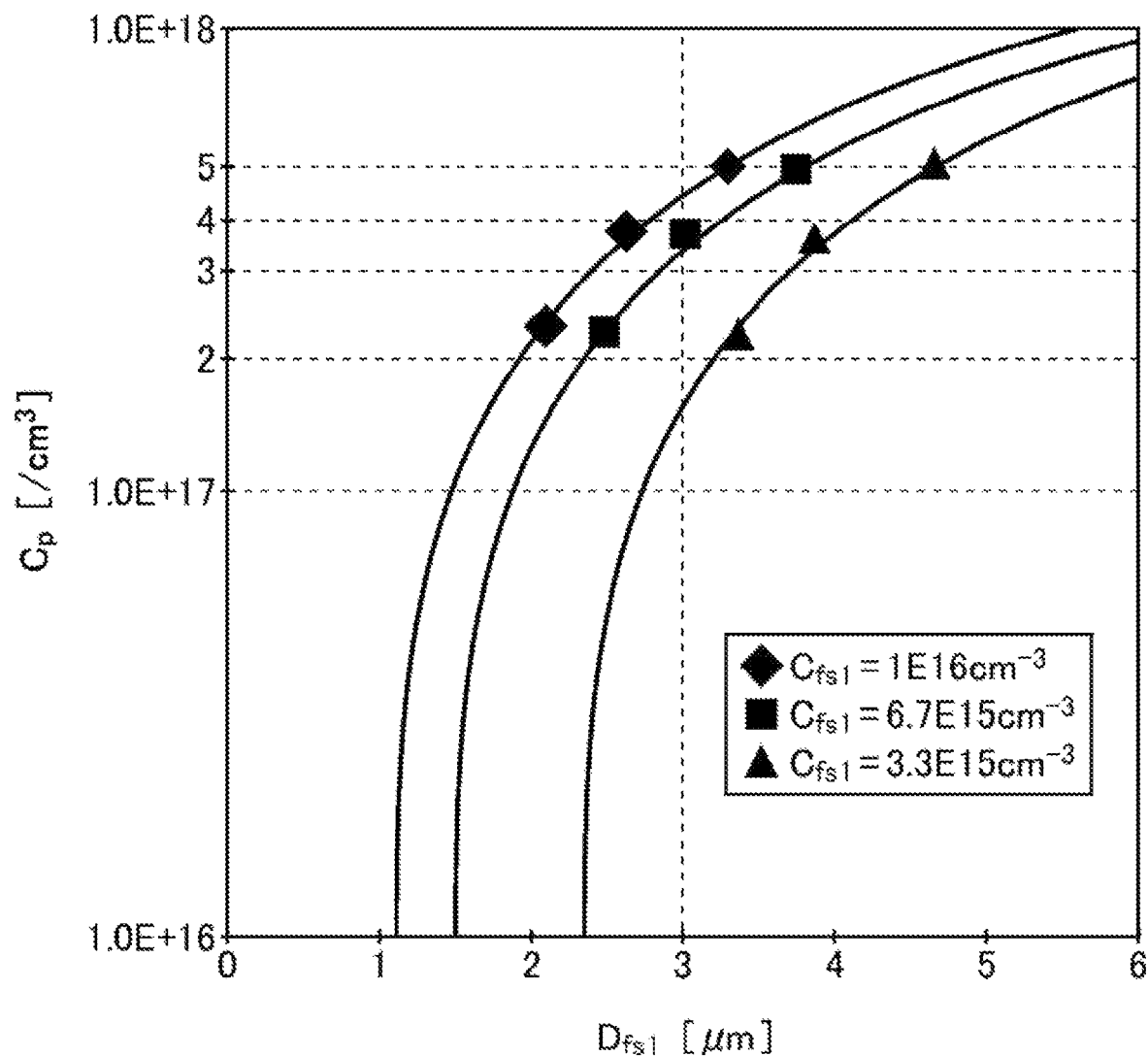
FIG. 3 is a diagram showing a boundary as to whether or not the back surface avalanche occurs, using the horizontal axis as the distance $D_{fs1}$ between a first peak 22-1 and the lower surface of the semiconductor substrate 10 and the vertical axis as the doping concentration $C_p$ of a collector region 20.

FIG. 3 is a diagram showing a boundary as to whether or not the back surface avalanche occurs, when the horizontal axis is the distance $D_{fs1}$ between the first peak 22-1 and the lower surface of the semiconductor substrate 10 and the vertical axis is the doping concentration $C_p$ of the collector region 20. The vertical axis is the logarithmic axis.

In the example in FIG. 3, the doping concentration $C_{fs1}$ of the first peak 22-1 is set to three values of $3.3 \times 10^{15}/cm^3$, $6.7 \times 10^{15}/cm^3$, and $1.0 \times 10^{16}/cm^3$, and the boundary is shown in each case. Note that, in FIG. 3, with respect to the semiconductor device 100 having the rated voltage 1200 V, 600 V (source voltage) is applied as the collector-emitter voltage, and 20 V is applied as the gate-emitter voltage. Note that even though the applied voltage conditions are changed, results similar to FIG. 3 will be obtained.

The plots indicated by squares, triangles, and the like in FIG. 3 indicate sample values, and the solid lines show approximate curves approximating the sample values by curves. The back surface avalanche does not occur in the left region of the approximate curves, and occurs in the right region of the approximate curves.

As shown in FIG. 3, the occurrence of the back surface avalanche can be prevented by decreasing the distance $D_{fs1}$, without increasing the doping concentration $C_p$ of the collector region 20 so much. Thus, the short circuit withstand capability can be improved without increasing the turn-off power loss.

In addition, when the semiconductor device 100 operates at high speed, it becomes difficult to increase the doping concentration $C_p$ of the collector region 20. As an example, the semiconductor device 100 may perform switching operations in frequency approximately 2 kHz or more and 30 kHz or less. The semiconductor device 100 in this example can prevent the back surface avalanche from occurring, even with low doping concentration $C_p$ of the collector region 20. Thus, both speeding up the switching operation and improving the short circuit withstand capability can be possible.

As an example, the distance $D_{fs1}$ may be 3 μm or less, and the doping concentration $C_{fs1}$ may be $1.0 \times 10^{16}/cm^3$ or less. This can prevent the back surface avalanche from occurring even though the doping concentration $C_p$ of the collector region 20 is decreased to approximately $5.0 \times 10^{17}/cm^3$. The doping concentration $C_p$ may be $5.0 \times 10^{17}/cm^3$ or more. In addition, the doping concentration $C_{fs1}$ may be $6.7 \times 10^{15}/cm^3$ or less. This can prevent the back surface avalanche from occurring even though the doping concentration $C_p$ of the collector region 20 is decreased to approximately $4.0 \times 10^{17}/cm^3$. The doping concentration $C_p$ may be $4.0 \times 10^{17}/cm^3$ or more. In addition, the doping concentration $C_{fs1}$ may be $3.3 \times 10^{15}/cm^3$ or less. This can prevent the back surface avalanche from occurring even though the doping concentration $C_p$ of the collector region 20 is decreased to approximately $2.0 \times 10^{17}/cm^3$. The doping concentration $C_p$ may be $2.0 \times 10^{17}/cm^3$ or more.

As an example, the distance $D_{fs1}$ may be 2 μm or less, and the doping concentration $C_{fs1}$ may be $1.0 \times 10^{16}/cm^3$ or less. This can prevent the back surface avalanche from occurring even though the doping concentration $C_p$ of the collector region 20 is decreased to approximately $3.0 \times 10^{17}/cm^3$. The doping concentration $C_p$ of the collector region 20 may be $3.0 \times 10^{17}/cm^3$ or more. In addition, the doping concentration $C_{fs1}$ may be $6.7 \times 10^{15}/cm^3$ or less. This can prevent the back surface avalanche from occurring even though the doping concentration $C_p$ of the collector region 20 is decreased to approximately $2.0 \times 10^{17}/cm^3$. The doping concentration $C_p$ of the collector region 20 may be $2.0 \times 10^{17}/cm^3$ or more. In addition, the doping concentration $C_{fs1}$ may be $3.3 \times 10^{15}/cm^3$ or less. This can prevent the back surface avalanche from occurring even though the doping concentration $C_p$ of the collector region 20 is decreased to very small value.

As an example, the distance $D_{fs1}$ may be 1.5 μm or less, and the doping concentration $C_{fs1}$ may be $1.0 \times 10^{16}/cm^3$ or less. This can prevent the back surface avalanche from occurring even though the doping concentration $C_p$ of the collector region 20 is decreased to approximately $2.0 \times 10^{17}/cm^3$. The doping concentration $C_p$ of the collector region 20 may be $2.0 \times 10^{17}/cm^3$ or more. In addition, the doping concentration $C_{fs1}$ may be $6.7 \times 10^{15}/cm^3$ or less. This can prevent the back surface avalanche from occurring even though the doping concentration $C_p$ of the collector region 20 is decreased to very small value.

As an example, the distance $D_{fs1}$ may be 1.5 μm or less, and the doping concentration $C_{fs1}$ may be $1.0 \times 10^{16}/cm^3$ or less. This can prevent the back surface avalanche from occurring even though the doping concentration $C_p$ of the collector region 20 is decreased to very small value. The distance $D_{fs1}$ may be 1.0 μm or less.

In addition, the doping concentration $C_p$ of the collector region 20 is $1.0 \times 10^{18}/cm^3$ or less, as an example. This facilitates high speed operation of the semiconductor device 100. The doping concentration $C_p$ may be $5.0 \times 10^{17}/cm^3$ or less. As shown in FIG. 3, even though the doping concentration $C_p$ is $5.0 \times 10^{17}/cm^3$ or less, setting the distance $D_{fs1}$ to 3 μm or less can easily prevent the back surface avalanche from occurring. In this case, the doping concentration $C_{fs1}$ of the first peak 22-1 is preferably $1.0 \times 10^{16}/cm^3$ or less. In addition, the doping concentration $C_p$ can be set to $2.0 \times 10^{17}/cm^3$ or less. In this case, the distance $D_{fs1}$ is preferably 2.0 μm or less.

Figure 4:
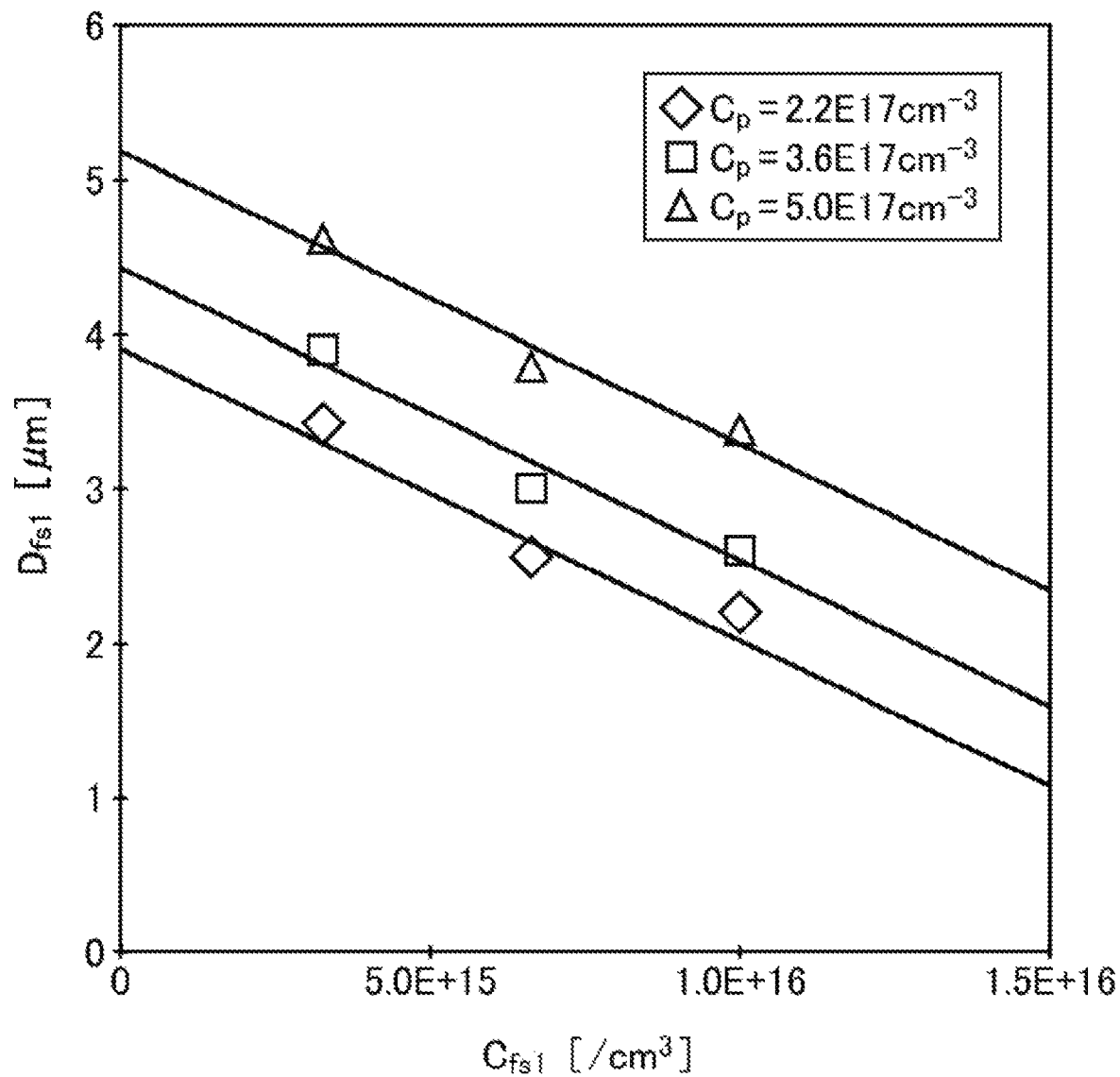
FIG. 4 is a diagram showing the boundary as to whether or not the back surface avalanche occurs depicted in the FIG. 3, for each doping concentration $C_p$ of the collector region 20, using the horizontal axis as the doping concentration $C_{fs1}$ and the vertical axis as the distance $D_{fs1}$.

FIG. 4 is a diagram showing the boundary as to whether or not the back surface avalanche occurs depicted in the FIG. 3, for each doping concentration $C_p$ of the collector region 20, where the horizontal axis is the doping concentration $C_{fs1}$ and the vertical axis is the distance $D_{fs1}$. The plots indicated by squares, triangles, and the like in FIG. 4 indicate sample values, and the solid lines show approximate lines approximating the sample values by straight lines. The back surface avalanche does not occur in the lower region of the approximate lines, and occurs in the upper region of the approximate lines.

As shown in FIG. 4, the slopes of the approximate lines show a constant value regardless of the doping concentration $C_p$ of the collector region 20. The slope of the approximate lines in this example is approximately $-2.0 \times 10^{16}$. It is preferable that both the depth position $D_{fs1}$ of the first peak 22-1 and the doping concentration $C_{fs1}$ of the first peak 22-1 satisfy the following equation.

$$D_{fs1} < -2.0 \times 10^{-16} \times C_{fs1} + b \quad \text{Equation (1)}$$

Note that b is an intercept of the approximate line shown in FIG. 4 and is determined depending on the doping concentration $C_p$ of the collector region 20.

Figure 5:
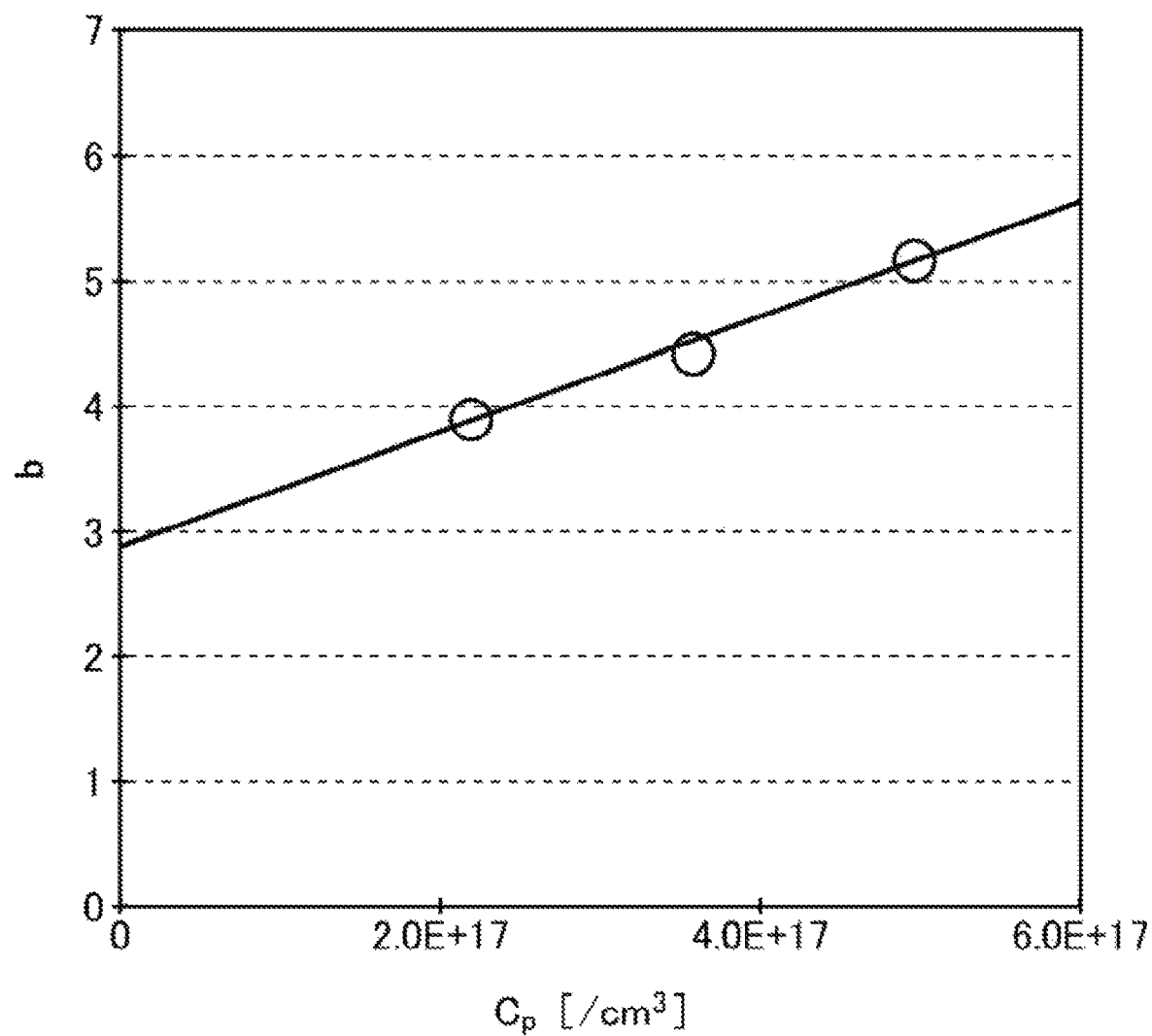
FIG. 5 is a diagram showing the relation between the doping concentration $C_p$ of the collector region 20 and the intercept b.

FIG. 5 is a diagram showing the relation between the doping concentration $C_p$ of the collector region 20 and the intercept b. The circles in FIG. 5 plot intercepts of each straight line shown in FIG. 4. The solid lines in FIG. 5 approximate each plot by straight lines. As shown in FIG. 5, the relation between the doping concentration $C_p$ of the collector region 20 and the intercept b can be approximated by straight line. The straight line is given by the following equation.

$$b = 4.0 \times 10^{-18} \times C_p + 2.9 \quad \text{Equation (2)}$$

It is preferable that the doping concentration $C_p$ of the collector region 20, the doping concentration $C_{fs1}$ of the first peak 22-1, and the depth position $D_{fs1}$ of the first peak 22-1 satisfy the relations shown in Equation (1) and (2). This can prevent the back surface avalanche from occurring.

In case of short circuit, the reason why the avalanche breakdown occurs on the back surface side (i.e., the collector side) is as follows. In a condition that the gate of the IGBT is turned off and a voltage is applied between the collector and the emitter, a depletion layer is formed. On the back surface side, the depletion layer is stopped at the shallowest portion of the buffer region 18 (or the peak of the doping concentration, in the buffer region 18, closest to the back surface side). That is, the edge of the depletion layer on the back surface side is located around the peak position in the shallowest portion of the buffer region 18 on the back surface side. On the back surface side from the edge of the depletion layer, the shallowest portion of the buffer region 18 and the collector region exist, and these two layers are a charge neutral region with zero space charge density.

When the gate of the IGBT is turned on, electrons directly enter the depletion layer from an inversion layer formed in the base region and drift to the edge of the depletion layer. After that, they enter the collector region through the charge neutral region. On the other hand, holes enter the shallowest portion of the buffer region 18 from the collector region in response to electrons entering. Through the charge neutral region of the shallowest portion of the buffer region 18, holes enter the depletion layer from the edge of the depletion layer, and drift toward the base region.

As the gate is turned on, the current density of the collector-emitter current is increased in a moment. Assuming that the gate voltage is $V_G$ and the gate threshold is $V_T$, the current density of the collector-emitter current is increased to the saturation current value $J_{sat}$, which is determined with $V_G - V_T$. $J_{sat}$ is represented as, $$J_{sat} = \left(\frac{\mu_n C_{ox}}{2L_{CH}}\right)(V_G - V_T)^2 \left(\frac{1}{1 - \alpha_{PNP}}\right) f_A \quad \text{[Equation 1]}$$

$\mu_n$ is the electron mobility (cm$^2$/Vs) of the inversion layer channel, $C_{ox}$ is the MOS gate capacitance (F/cm$^2$), $L_{CH}$ is the inversion layer channel width (cm), $\alpha_{PNP}$ is the current gain of the collector region (P)-buffer region and the drift layer (N)-base region (P) in the IGBT, and $f_A$ is the number of unit cells, including one inversion layer channel, per 1 cm$^2$. The unit cell refers to a region from the center position of the width direction of the gate trench portion 30 to a position separated by half of the array pitch of the gate trench portion 30 with the length (y direction) being 1 μm. In the cross section shown in FIG. 1, the region from the center of the gate trench portion 30 in the width direction to the center of the adjacent base region 14 in the width direction corresponds to the unit cell. The width direction refers to the X-axis direction perpendicular to the depth direction in the cross section shown in FIG. 1. Assuming that the unit cell is Wcell (μm) in width and 1 μm in length (Y-axis direction), $f_A$=1E8/Wcell. Note that the same structures continue for the predetermined length in the length direction. The number of the unit cell in the actual semiconductor device is a value obtained, for example, by multiplying area (cm$^2$) of the region in which the MOS gate is formed in the active region by $f_A$.

As an example, the gate voltage is 10-20 V, for example 15 V. As an example, the gate threshold is 6-9 V, for example 7.8 V. $\mu_n$ may be 500-800 (cm$^2$/Vs). $C_{ox}$ is represented as εox/tox, where tox (cm) and εox (F/cm) are a gate insulating film's thickness and its dielectric constant, respectively. As an example, tox is 0.05-0.25 μm (conversion to cm is multiplied by 1E-4), for example 0.2 μm. If the insulating film is a silicon oxide film, εox is a value obtained by multiplying the dielectric constant of vacuum by its relative dielectric constant 3.9. The insulating film may be a silicon nitride film or any other dielectric materials, not limited to the silicon oxide film. As an example, the inversion layer channel width is 1-3 μm, for example 2 μm.

$J_{sat}$ is represented as the following equation by using $J_{sat,n}$ of the electron part injected from the MOS gate and adding $J_p$ of the hole current part amplified by holes injected from the collector region.

$$J_{sat} = J_{sat,n}\left(\frac{1}{1-\alpha_{PNP}}\right) \equiv J_{sat,n} + J_p \quad \text{[Equation 2A]}$$

Then, $J_p$ is represented as, $$J_p = J_{sat,n}\left(\frac{\alpha_{PNP}}{1-\alpha_{PNP}}\right) \quad \text{[Equation 2B]}$$

Also, $J_{sat,n}$ is represented as, $$J_{sat,n} = \left(\frac{\mu_n C_{ox}}{2L_{CH}}\right)(V_G - V_T)^2 f_A \quad \text{[Equation 2C]}$$

Assuming that, using the charge density, the concentration of holes is p (/cm$^3$), the concentration of electrons is n (/cm$^3$), and the doping concentration of the drift region is $N_D$ (/cm$^3$), the Poisson's equation in the drift region in occurrence of a short circuit is represented as, $$\text{div } E = \left(\frac{q}{\varepsilon_0 \varepsilon_r}\right)(p - n + N_D) \quad \text{[Equation 3]}$$

The doping concentration may be a concentration of activated impurities among impurities, such as phosphorous, doped in the semiconductor substrate 10. It is assumed that no acceptor exists in the drift region. Since the source voltage VCC is applied to the IGBT immediately before occurrence of a short circuit, the drift region has been already depleted and the space charge region has been formed. At the time, since it is considered no electron exists, the space charge density is p+$N_D$>0, and the value of the space charge is positive. Thus, a slope of the electric field E is a positive value and a peak position of the electric field strength is located near the p-n junction between the base region and the drift region.

It is assumed that the electron current density would be several 100 A/cm$^2$ or more, for example 1000 A/cm$^2$, because when the gate is turned on and a short circuit occurs, electrons injected from the MOS gate flow at a value of at least the saturation current density determined by $V_G$-$V_T$. In the space charge region, since it may be considered the carrier velocity is saturated, in the case of silicon the electron saturation velocity $V_{sat,n}$ is approximately 1E7 (cm/s) and the hole saturation velocity $V_{sat,p}$ is approximately 7E6 (cm/s). Therefore, the concentration of electrons in the space charge region is approximately 3E14/cm$^3$, based on the following equation:

$$n = \frac{J_{sat,n}}{qv_{sat,n}} \quad \text{[Equation 4]}$$

Since the doping concentration of the drift region is 1E13 to 1E14/cm$^3$, the concentration of electrons in case of short circuit is already higher than the doping concentration. Thus, the polarity of the space charge is inverted from positive to negative, depending on a balance with the density of holes injected from the collector region. Therefore, the slope of the electric field E is inverted from positive to negative. The inversion of the slope of the electric field E causes the peak position of the electric field strength to move from the position near the p-n junction on the front surface side to the back surface side. If the concentration of holes is small, the space charge is increased with negative value, and further the peak value of the electric field strength reaches the critical electric field strength, an avalanche occurs on the back surface side leading to a breakdown of a device.

In particular, since the semiconductor device 100 has, on the back surface side, the buffer region 18 with a higher concentration than that in the drift region 16, the drift region 16 preferably has lower concentration than that in the structure without the buffer region 18, in order to prevent the breakdown voltage from decreasing. As a result, it has a challenge that the polarity inversion of the space charge in the drift region 16 is more likely to occur in occurrence of a short circuit.

After occurrence of a short circuit, in order to prevent the polarity inversion of the space charge, holes need to be injected into the drift region 16 so that the following equation is satisfied in the drift region 16.

$$p + N_D > n \quad \text{[Equation 5]}$$

In particular, in this example, the concentration of holes needs to be maintained so that the above equation is satisfied in the drift region 16 in which the buffer region 18 is not formed. This can be obtained by increasing $\alpha_{PNP}$ in Equation 2B. Since holes are also drifting similar to electrons in the space charge region, the velocity is saturated. Thus, the concentration of holes in the space charge region is represented as, $$p = \frac{J_p}{qv_{sat,p}} \quad \text{[Equation 6]}$$

Therefore, when substituting Equation 2B and Equation 4, Equation 5 is represented as, $$\left(\frac{J_{sat,n}}{qv_{sat,p}}\right)\left(\frac{\alpha_{PNP}}{1-\alpha_{PNP}}\right) + N_D > \left(\frac{J_{sat,n}}{qv_{sat,n}}\right) \quad \text{[Equation 7]}$$

As this equation is modified with respect to $\alpha_{PNP}$, the resulting equation is represented as, $$\alpha_{PNP} > 1 - \frac{1}{1 + v_{sat,p}\left(\frac{1}{v_{sat,n}} - \frac{qN_D}{J_{sat,n}}\right)} \quad \text{[Equation 8]}$$

In Equation 8, variables reflecting a device structure are $\alpha_{PNP}$, $N_D$, and $J_{sat,n}$. The current gain $\alpha_{PNP}$ may be a value when, in the off-state before a short circuit occurs, the source voltage is applied, or may be a value in occurrence of a short circuit, which is a value between 0 and 1. Based on Equation 2A and Equation 6, the closer to 1 $\alpha_{PNP}$ is, the more the concentration of holes in the space charge region is increased. Thus, in occurrence of a short circuit, in order to prevent the polarity inversion of the space charge in the drift region 16 from occurring, $\alpha_{PNP}$ has only to be greater than the right side in Equation 8.

In Equation 8, $\alpha_{PNP}$ has only to be greater than at least 0, in this case, the value of the fraction in the right side has only to be less than 1. That is, the value within the brackets in the right side of Equation 8 has only to be, for example, a positive value. In this case, $$N_D < \frac{J_{sat,n}}{qv_{sat,n}} \quad \text{[Equation 9]}$$

Thus, the value obtained by dividing the saturation current density $J_{sat,n}$ due to electrons injected from the MOS gate by the elementary charge and the electron saturation velocity has only to be greater than the donor doping concentration of the drift region.

The higher the rated voltage or breakdown voltage of the semiconductor device 100 is, the more the donor doping concentration $N_D$ of the drift region 16 is decreased. Therefore, in Equation 8, when $N_D$ is reduced close to zero to take the limit, $\alpha_{PNP}$ is, $$\alpha_{PNP} > 1 - \frac{1}{1 + \frac{v_{sat,p}}{v_{sat,n}}} \quad \text{[Equation 8B]}$$

In the case of silicon, substituting the above-described value results in $\alpha_{PNP} > 0.4118$. That is, if $\alpha_{PNP}$ is greater than 0.4118, Equation 5, 7, and 8 can be always satisfied, which is preferable.

Figure 6:
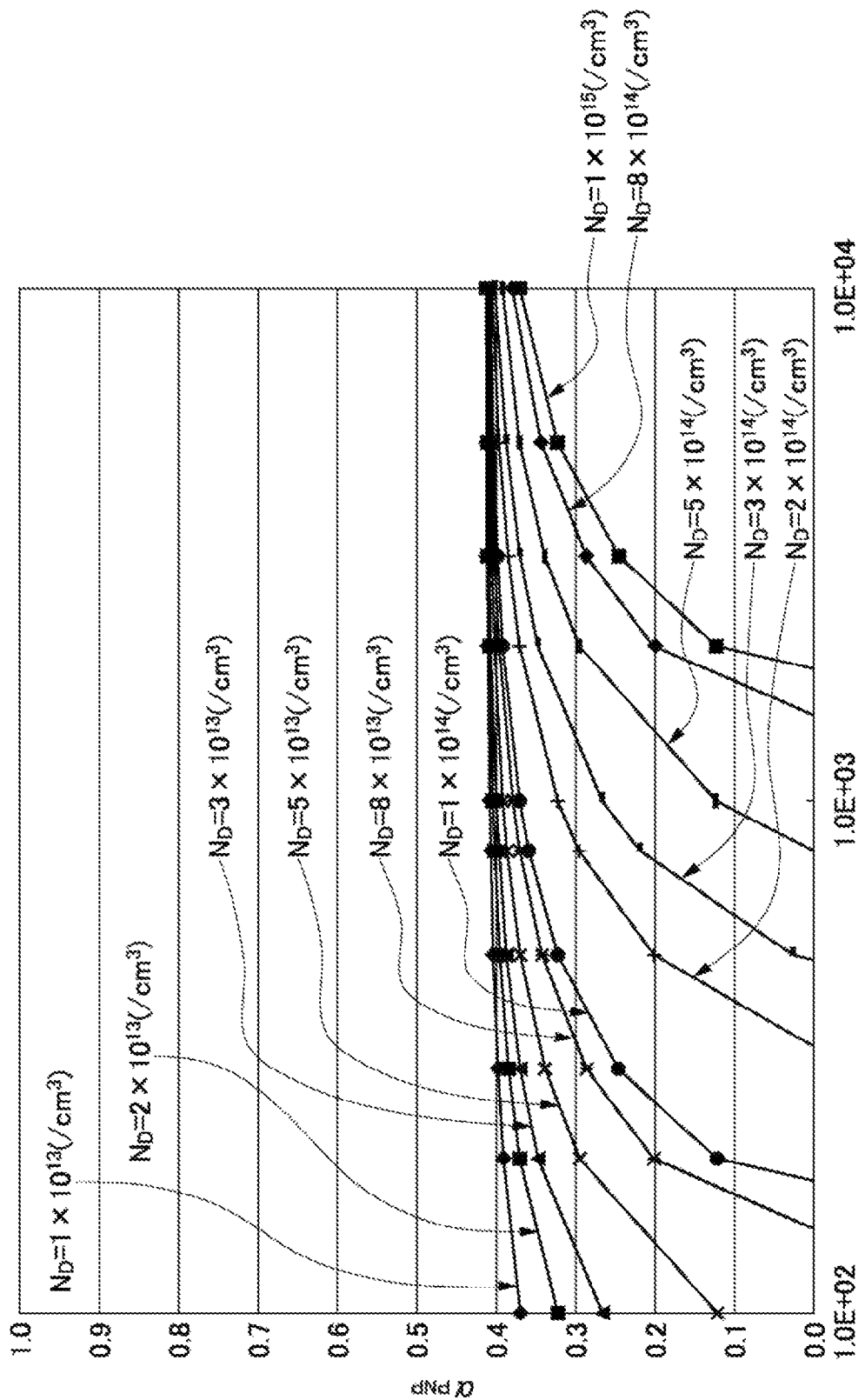
FIG. 6 is a graph showing the dependence of $\alpha_{PNP}$ on $J_{sat,n}$, using $N_D$ as a parameter in Equation 8.

FIG. 6 is a graph showing the dependence of $\alpha_{PNP}$ on $J_{sat,n}$, using $N_D$ as a parameter in the Equation 8. The material of the semiconductor substrate 10 is silicon, but it may be SiC, GaN, or the like. The region in which Equation 8 is satisfied is on the upper side (that is, the side on which the numerical value of the vertical axis $\alpha_{PNP}$ is increased) of the line in the graph, in each doping concentration $N_D$ of the drift region 16. That is, each line in the graph is the lower limit line of $\alpha_{PNP}$ at each $N_D$. As $N_D$ is increased, the lower limit line of $\alpha_{PNP}$ is decreased and the region satisfying Equation 8 becomes wider. Depending on these concentrations of the drift region 16, $\alpha_{PNP}$ satisfying Equation 8 may be determined. In addition, at each $N_D$, $\alpha_{PNP}$ may be 1.5 times or more of the lower limit value, and further may be 2 times or more. As $N_D$ is decreased, $\alpha_{PNP}$ being the lower limit converges on the above-described value, 0.4118.

Also, in Equation 8, $\alpha_{PNP}$ may be 0.33 or more, for example. In this case, the value within the brackets of the right side of Equation 8 may be $0.5/V_{sat,p}$ or more. In this case, the following equation is obtained.

$$N_D > \frac{J_{sat,n}}{q}\left(\frac{1}{v_{sat,n}} - \frac{0.5}{v_{sat,p}}\right) \quad \text{[Equation 10]}$$

In Equation 10, every term other than $J_{sat,n}$ is a constant, and the following equation is obtained.

$$N_D > 1.7857 \times 10^{11} J_{sat,n} \quad \text{[Equation 11]}$$

That is, the donor doping concentration $N_D$ of the drift region 16 may be greater than the value multiplying the saturation current density of electrons $J_{sat,n}$ by 1.7857E+11.

That $\alpha_{PNP}$ satisfies Equation 8 is described as follows. $\alpha_{PNP}$ is $\gamma_C \times \alpha_T \times \gamma_E$, as described above. The collector injection efficiency $\gamma_C$ may be 1. The base transport factor $\alpha_T$ is represented as, $$\alpha_T = \frac{1}{\cosh(W_{CNZ}/L_a)} \quad \text{[Equation 12]}$$

$W_{CNZ}$ is a length (μm) of charge neutral region in the Z direction, and $L_a$ is the bipolar diffusion length (μm). $W_{CNZ}$ will be described later. $L_a$ is $(D_a \tau_{HL})^{0.5}$. Herein, $D_a$ (cm2/s) is the bipolar diffusion coefficient of carriers, represented as $2D_p D_n/(D_p + D_n)$, where $D_n$ and $D_p$ are the electron diffusion coefficient and hole diffusion coefficient, respectively. $\tau_{HL}$ (s) is represented as $\tau_{HL}^{-1} = \tau_n^{-1} + \tau_p^{-1}$ where $\tau_n$ and $\tau_p$ are the electron lifetime and the hole lifetime, respectively. $\gamma_E$ is represented as, $$\gamma_E = \beta_E/(1+\beta_E) \quad \text{[Equation 13]}$$

where $\beta_E$ is an emitter current gain. Further, $\beta_E$ is represented as, $$\beta_E = \left(\frac{D_{p,CNZ}}{D_{n,P}}\right)\left(\frac{L_{n,C}}{W_{CNZ}}\right)\left(\frac{N_{A,C}}{N_{D,CNZ}}\right)\left(\frac{n_{ie,CNZ}^2}{n_{ie,P}^2}\right) \quad \text{[Equation 14]}$$

The suffix P indicates the collector region. $L_{n,C}$ is an electron diffusion length (μm) in the collector region 20, $N_{A,C}$ is a maximum acceptor concentration of the collector region 20, $N_{D,CNZ}$ is a donor concentration in the charge neutral region, and $n_{ie}$ is an effective intrinsic carrier concentration (cm$^{-3}$) in the charge neutral region (CNZ) or the collector region (P).

In Equation 14 showing the emitter current gain $\beta_E$, the main four variables that reflect device structure are $L_{n,C}$, $W_{CNZ}$, $N_{A,C}$, and $N_{D,CNZ}$. Among the variables $L_{n,C}$ may be replaced with $X_P$ in Equation 10, because the depth $X_P$ of the collector region 20 is approximately 0.2 to 0.5 μm and it is a transparent emitter sufficiently thinner than the diffusion length $L_{n,C}$. The current gain $\alpha_{PNP}$ is a value between 0 and 1, and the above-described four variables may be set so that (1) at least $\alpha_{PNP}$ is close to 1 or (2) $\alpha_{PNP}$ satisfies Equation 8.

$N_{A,C}$ is the maximum concentration of the collector region 20, and it is approximately 1E16 to 1E18/cm$^3$. $N_{D,CNZ}$ is the doping concentration of the charge neutral region, and it may be a maximum concentration of a region not depleted in the shallowest portion of the buffer region 18, for example. The shallowest portion of the buffer region 18 may be a region including the shallowest peak 22-1 shown in FIG. 2 and having a single mountain-shaped doping concentration distribution. The boundary of the single mountain-shape in the doping concentration distribution may be a position at which the doping concentration turns from a decrease to an increase, or may be a position at which the doping concentration turns from a decrease to a constant value, when traced in the skirt direction from the peak position of the mountain-shape in the depth direction.

The doping concentration of the shallowest portion of the buffer region 18 may be set as follows. In case of short circuit, due to electrons existing in the space charge region, the space charge density is smaller than in no short circuit. Therefore, the doping concentration of the shallowest portion of the buffer region 18 is preferably set so that the integrated concentration integrating the doping concentration of the shallowest portion of the buffer region 18 in the depth direction is greater than the critical integrated concentration nc. Herein, the critical integrated concentration nc. is a value multiplying the critical electric field strength Ec by a dielectric constant of a semiconductor and dividing it by the elementary charge q, for example $1.2E12/cm^2$ for silicon. The integrated concentration of the entire buffer region 18 may be greater than the critical integrated concentration nc.

The length in the depth direction of the shallowest portion of the buffer region 18 may be 5 μm or less, for example, and the peak value of the doping concentration may be $2.4E15/cm^3$ or more. A region not depleted in the shallowest portion of the buffer region 18 may be set to $N_{D,CNZ}$. ($N_{A,C}/N_{D,CNZ}$) may be 4 or more and 400 or less, or may be 10 or more and 200 or less.

Figure 7:
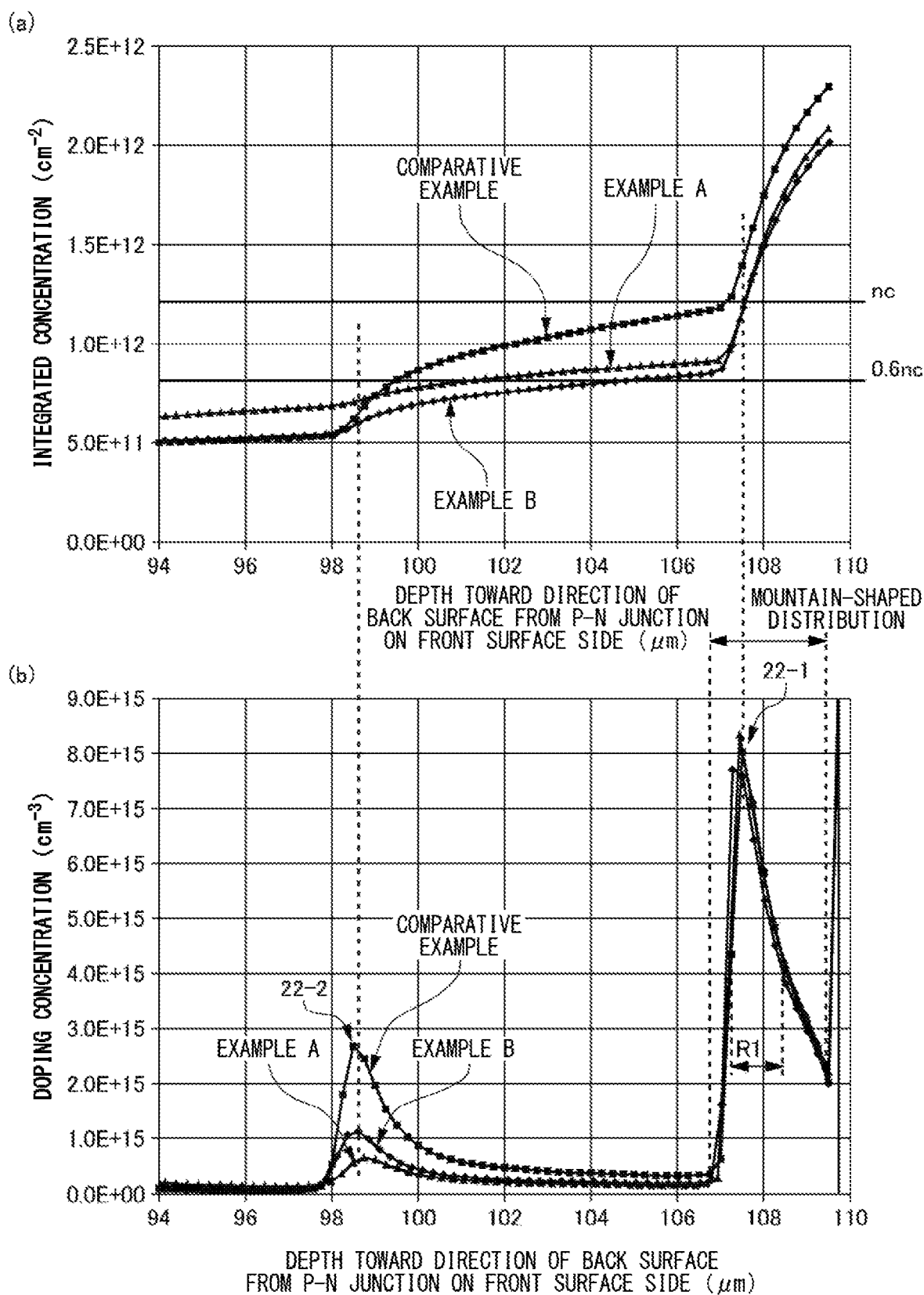
FIG. 7 is a diagram showing the integrated concentration and the doping concentration distribution in the depth direction, regarding the example A, example B, and comparative example.

FIG. 7 is a diagram showing the integrated concentration and the doping concentration distribution in the depth direction, regarding the example A, example B, and comparative example. The (a) part in FIG. 7 shows the integrated concentration. The integrated concentration is a diagram of the integrated concentration integrating the doping concentration of the drift region 16 and the buffer region 18 from the position of the p-n junction between the base region 14 and the drift region 16 toward the back surface side to a predetermined position. The (b) part in FIG. 7 is a diagram of the doping concentration distribution corresponding to the (a) part. Note that FIG. 7 shows a range in which the collector region 20 at the back surface, the shallowest peak 22-1 of the buffer region 18, and the adjacent peak 22-2 are magnified. The drift region 16 exists on the front surface side of the indicated range in FIG. 7.

A position at which the integrated concentration reaches 0.6nc may be located between the position of the shallowest peak 22-1 in the buffer region 18 and the adjacent peak 22-2. In the example A, the position at which the integrated concentration reaches 0.6nc is closer to the adjacent peak 22-2 than the shallowest peak 22-1, and the position is located at 101.5 μm on the horizontal axis of (a) in FIG. 7. In the example B, the position at which the integrated concentration reaches 0.6nc is closer to the shallowest peak 22-1 than the adjacent peak 22-2, and the position is located at 104.7 μm on the horizontal axis of (a) in FIG. 7.

Also, like the example A and the example B, the doping concentration of the position at which the integrated concentration reaches 0.6nc may be lower than the half value of the peak concentration of the adjacent peak 22-2. In the comparative example in FIG. 7, the doping concentration of the position at which the integrated concentration reaches 0.6nc is greater than the half value of the peak concentration of the adjacent peak 22-2.

In addition, a position at which the integrated concentration reaches the critical integrated concentration nc may be within the range provided with full width at half maximum R1 of the mountain-shaped distribution including the peak 22-1, on both the upper and lower sides from the position of peak 22-1. Also, the integrated concentration from the position of the shallowest peak 22-1 to the position of the p-n junction between the buffer region 18 and the collector region 20 may be nc or less. This increases the injection efficiency of the hole current from the collector region 20 in case of short circuit, thereby $\alpha_{PNP}$ can increase more stably, for example 0.5 or more.

In the case of this example, when the source voltage is applied in the off-state before a short circuit occurs, the edge of the depletion layer is between the peak 22-1 and the peak 22-2. The source voltage is approximately 50 to 70% of the rated voltage, for example 66%. In this case, the integrated concentration to the edge of the depletion layer is 60 to 80% of nc.

The length $W_{CNZ}$ of the charge neutral region in case of short circuit is a length of a region not depleted in the shallowest portion of the buffer region 18. When the shallowest portion of the buffer region 18 stops the space charge region in case of short circuit, a part of it is depleted and the remainder is the charge neutral region. Thus, the length $W_{CNZ}$ of the charge neutral region is 3 μm or less. On the other hand, when the space charge region reaches the collector region, holes are injected directly into the space charge region. Thus, the space charge region shrinks to the front surface side, so that the source voltage cannot be supported, then the semiconductor device is destroyed. In order to prevent this, the length $W_{CNZ}$ of the charge neutral region needs to be greater than $L_a$ at which $\alpha_T$ in Equation 12 is 0.1 or less, for example $W_{CNZ}$ has only to be 0.5 μm or more.

In addition, it is understood from Equation 7 that if $\alpha_{PNP}$ is sufficiently increased, for example 0.8 or more, and the saturation current density of electrons from the MOS gate is decreased in case of short circuit, the relation of Equation 5 is easily satisfied. In order to decrease the saturation current density of electrons, $f_A$ has only to be decreased in Equation 2C.

Figure 8:
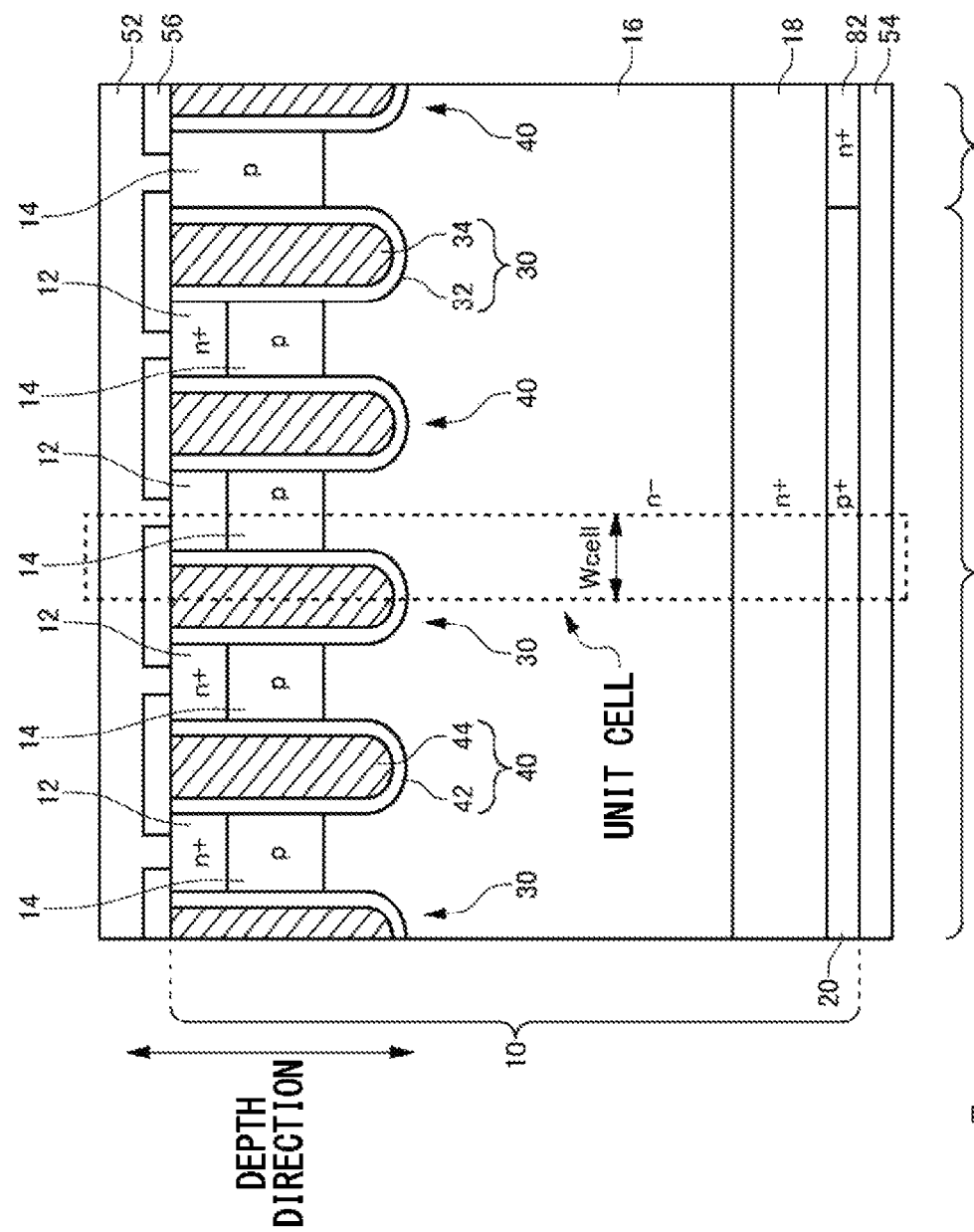
FIG. 8 is a diagram showing another example of the cross section of the semiconductor device 100.

FIG. 8 is a diagram showing another example of the cross section of the semiconductor device 100. The semiconductor device 100 of this example includes one or more dummy trench portions 40 between gate trench portions 30. The dummy trench portion 40 includes a dummy insulating film 42 and a dummy conductive portion 44. The dummy insulating film 42 is formed on the inner wall of the dummy trench. The dummy conductive portion 44 is covered with the dummy insulating film 42 in the dummy trench. The dummy conductive portion 44 is electrically connected to the emitter electrode 52.

The gate trench portion 30 and the dummy trench portion 40 are provided at a certain pitch in the array direction perpendicular to the depth direction. In this example, the gate trench portion 30 and the dummy trench portion 40 are disposed alternately one by one. In this case, a unit cell includes one gate trench portion 30 and one dummy trench portion 40. By setting the width Wcell of the unit cell to 2 μm or more, $f_A$ becomes 5E7 or less and Equation 5 can be established.

In addition, two or more dummy trench portions 40 may be disposed between respective gate trench portions 30. By providing two or more dummy trench portions 40 and setting Wcell to 3 μm or less, $f_A$ can be 3.3E7 or less. In the ranges described above, Equation 5, 7, and 8 have only to be satisfied.

Note that the semiconductor device 100 in FIG. 8 is provided with a transistor portion 70 and a diode portion 80 in the semiconductor substrate 10. The transistor portion 70 is provided with the gate trench portion 30 and the dummy trench portion 40 which are described above. The diode portion 80 is provided with the dummy trench portion 40, and the gate trench portion 30 may not be provided. In addition, the diode portion 80 is not provided with the source region 12. Also, instead of the collector region 20, an n+ type cathode region 82 is provided.

Figure 9:
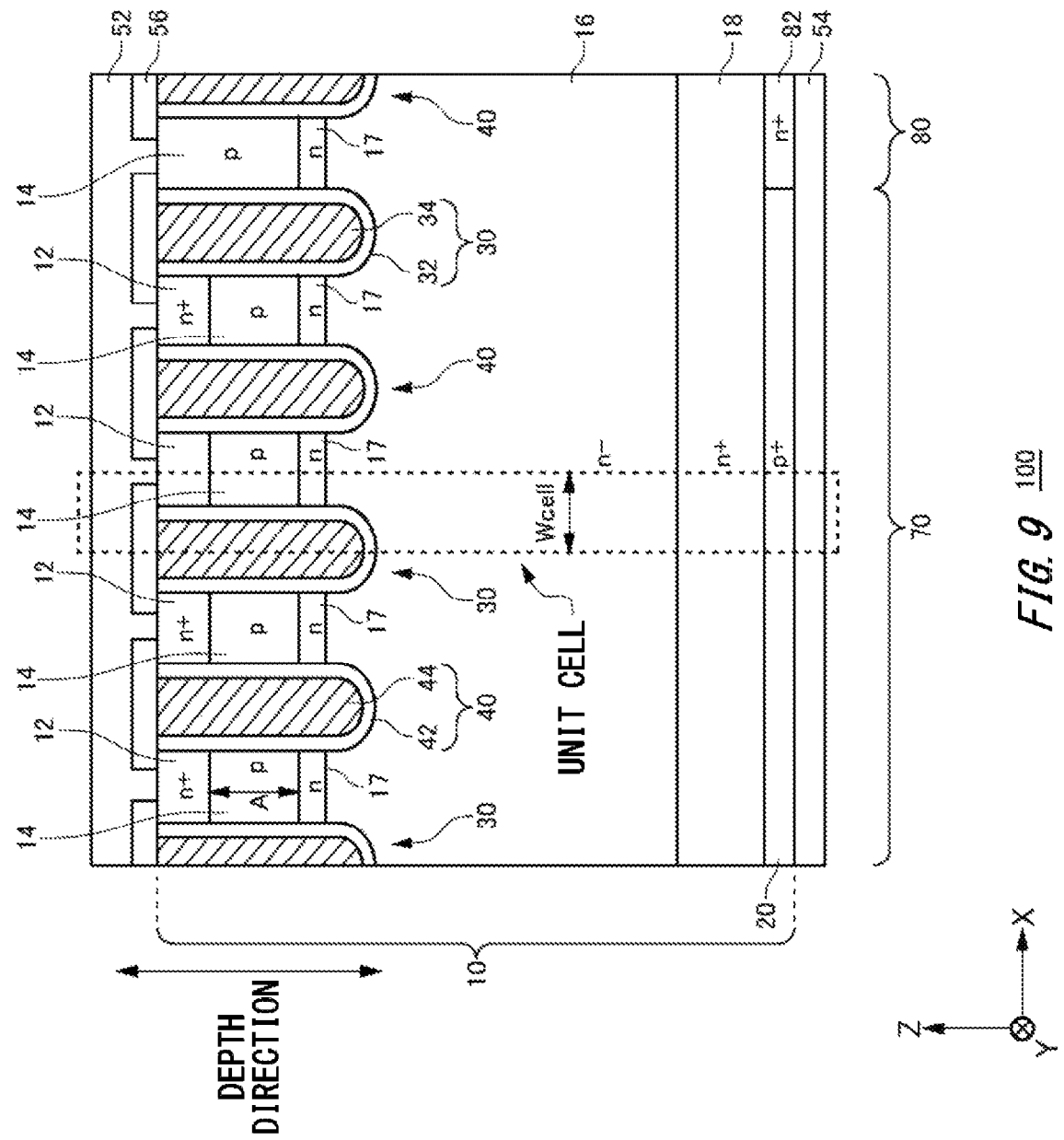
FIG. 9 is a diagram showing another example of the cross section of the semiconductor device 100.

FIG. 9 is a diagram showing another example of the cross section of the semiconductor device 100. The semiconductor device 100 of this example is different from other semiconductor devices 100 described in FIG. 1 through FIG. 8, in that it is provided with an accumulation region 17. In FIG. 9, a structure is shown providing the accumulation region 17 to the semiconductor device 100 shown in FIG. 8. The structure other than the accumulation region 17 may be the same as the semiconductor device 100 of any of the aspects described in FIG. 1 to FIG. 8.

The accumulation region 17 is provided between the base region 14 and the drift region 16, and is an n type region with a higher doping concentration than that in the drift region 16. The accumulation region 17 is the region in which donors are accumulated at a higher concentration than that in the drift region 16. The depth of the lower end of the accumulation region 17 may be shallower than the bottom of the trench portion, seen from the upper surface of the semiconductor substrate 10.

The length A from the source region 12 to the accumulation region 17 in the depth direction of the semiconductor substrate 10 (that is, the length A from the upper end of the base region 14 to the upper end of the accumulation region 17) may be the same as the inversion layer channel width $L_{CH}$. The length A may be longer than a differential length $D_{fs1}-D_b$, where $D_{fs1}$ is the distance from the lower surface of the semiconductor substrate 10 to the first peak 22-1, and $D_b$ is the distance from the lower surface of the semiconductor substrate 10 to the boundary between the first peak 22-1 and the collector region 20 (that is, the position of the p-n junction between the buffer region 18 and the collector region 20). In the accumulation region 17, due to increased electric field strength, the space charge region slightly narrows to the upper surface side and the length $W_{CNZ}$ of the charge neutral region may be longer to the upper surface side by that amount. In contrast, by making the length A longer than $D_{fs1}-D_b$, $L_{CH}$ in Equation 2c is increased to lower the saturation current density of electrons, and reduce the injection of electrons. This can facilitates to achieve the condition of Equation 5 with respect to the value of the predetermined $α_{PNP}$ and can prevent a polarity inversion of the space charge.

While the embodiments of the present invention have been described, the technical scope of the invention is not limited to the above-described embodiments. It is apparent to persons skilled in the art that various alterations and improvements can be added to the above-described embodiments. It is also apparent from the scope of the claims that the embodiments added with such alterations or improvements can be included in the technical scope of the invention.

EXPLANATION OF REFERENCES

10: semiconductor substrate, 12: source region, 14: base region, 16: drift region, 17: accumulation region, 18: buffer region, 20: collector region, 22: peak, 30: gate trench portion, 32: gate insulating film, 34: gate metal layer, 40: dummy trench portion, 42: dummy insulating film, 44: dummy conductive portion, 52: emitter electrode, 54: collector electrode, 56: interlayer dielectric film, 70: transistor portion, 80: diode portion, 82: cathode region, 100: semiconductor device

What is claimed is:
1. A semiconductor device comprising:
a semiconductor substrate;
a drift region having a first conductivity type formed in the semiconductor substrate;
a collector region having a second conductivity type, in the semiconductor substrate, formed between a lower surface of the semiconductor substrate and the drift region; and
a high concentration region having the first conductivity type, in the semiconductor substrate, formed between the drift region and the collector region and having a higher doping concentration than that in the drift region; and
a base region having a second conductivity type, in the semiconductor substrate, formed between the drift region and an upper surface of the semiconductor substrate,
wherein a doping concentration distribution of the high concentration region in a depth direction of the semiconductor substrate comprises a plurality of peaks,
wherein a position at which an integrated concentration obtained by integrating the doping concentrations of the drift region and the high concentration region, in a direction from a first p-n junction between the base region and the drift region toward a second p-n junction between the high concentration region and the collector region, reaches 0.6 times of a critical integrated concentration, is located between a first peak closest to the lower surface side of the semiconductor substrate among the peaks in the high concentration region and a second peak adjacent to the first peak, the critical integrated concentration being a value multiplying a critical electric field strength by a dielectric constant of a semiconductor and dividing it by an elementary charge.

2. The semiconductor device according to claim 1, the integrated concentration from the position of the first peak to the position of the p-n junction between the high concentration region and the collector region is the critical integrated concentration or less.

3. The semiconductor device according to claim 1, further comprising an accumulation region having a first conductivity type, provided between the base region and the drift region and having a higher doping concentration than that in the drift region,
wherein a length, in the depth direction of the semiconductor substrate, from an upper end of the base region to an upper end of the accumulation region is longer than a differential length $D_{fs1}-D_b$, $D_{fs1}$ being the distance from the lower surface of the semiconductor substrate to the first peak, $D_b$ being the distance from the lower surface of the semiconductor substrate to the position of the p-n junction between the high concentration region and the collector region.

4. A semiconductor device comprising:
a semiconductor substrate;
a drift region having a first conductivity type formed in the semiconductor substrate;
a collector region having a second conductivity type, in the semiconductor substrate, formed between a lower surface of the semiconductor substrate and the drift region; and
a high concentration region having the first conductivity type, in the semiconductor substrate, formed between the drift region and the collector region and having a higher doping concentration than that in the drift region; and a base region having a second conductivity type, in the semiconductor substrate, formed between the drift region and an upper surface of the semiconductor substrate, wherein a doping concentration distribution of the high concentration region in a depth direction of the semiconductor substrate comprises a plurality of peaks, wherein a position at which an integrated concentration obtained by integrating the doping concentrations of the drift region and the high concentration region, in a direction from a first p-n junction between the base region and the drift region toward a second p-n junction between the high concentration region and the collector region, reaches a critical integrated concentration region is in a region between a position that is on a lower side from a first peak position of the high concentration region by a full width at half maximum of the mountain-shaped doping concentration distribution including a first peak closest to a lower surface side of the semiconductor substrate and a position that is on an upper side from the first peak position of the high concentration region by the full width at half maximum, the critical integrated concentration being a value multiplying a critical electric field strength by a dielectric constant of a semiconductor and dividing it by an elementary charge.

5. The semiconductor device according to claim 4, wherein an integrated concentration value obtained by integrating the doping concentration of the high concentration region across the depth direction of the high concentration region is greater than or equal to the critical integrated concentration.

6. The semiconductor device according to claim 4, wherein a distance between the first peak and the lower surface of the semiconductor substrate is 2 µm or less.

7. The semiconductor device according to claim 4, wherein the doping concentration of the first peak is $1.0 \times 10^{16}/\text{cm}^3$ or less.

8. The semiconductor device according to claim 4, wherein the doping concentration of the first peak is $6.7 \times 10^{15}/\text{cm}^3$ or less.

9. The semiconductor device according to claim 4, wherein the doping concentration of the collector region is $1.0 \times 10^{18}/\text{cm}^3$ or less.

10. The semiconductor device according to claim 4, wherein the doping concentration of the collector region is $5.0 \times 10^{17}/\text{cm}^3$ or less.

11. The semiconductor device according to claim 4, wherein a distance from a boundary position in the depth direction between the collector region and the first peak to the lower surface of the semiconductor substrate is between 0.5 µm or more and 1.0 µm or less.

12. The semiconductor device according to claim 4, wherein the high concentration region includes hydrogen donors.

13. The semiconductor device according to claim 4, wherein a distance between the first peak and the lower surface of the semiconductor substrate is 3 µm or less.

14. The semiconductor device according to claim 4, wherein the doping concentration of the collector region $C_p$ (/cm$^3$), the doping concentration of the first peak $C_{fs1}$ (/cm$^3$), and the depth position of the first peak $D_{fs1}$ (µm) satisfy an equation below:

$$D_{fs1} < -2.0 \times 10^{-16} \times C_{fs1}{}^b,$$

where $b = 4.0 \times 10^{-18} \times C_p + 2.9$.

15. A semiconductor device comprising:
a semiconductor substrate;
a drift region having a first conductivity type formed in the semiconductor substrate;
a collector region having a second conductivity type, in the semiconductor substrate, formed between a lower surface of the semiconductor substrate and the drift region; and
a high concentration region having the first conductivity type, in the semiconductor substrate, formed between the drift region and the collector region and having a higher doping concentration than that in the drift region; and
a base region having a second conductivity type, in the semiconductor substrate, formed between the drift region and an upper surface of the semiconductor substrate,
wherein a doping concentration distribution of the high concentration region in a depth direction of the semiconductor substrate comprises a plurality of peaks including a first peak closest to the lower surface side of the semiconductor substrate and a second peak adjacent to the first peak,
a space charge region being formed in a region having a mountain-shaped doping concentration distribution including the second peak, in at least the drift region and the high concentration region, the semiconductor device comprising:
a source region having a first conductivity type formed between the base region and the upper surface of the semiconductor substrate; and
a trench MOS gate extending from the upper surface of the semiconductor substrate through the source region and the base region to the drift region,
wherein a current gain $\alpha_{PNP}$ is greater than, $$1 - \cfrac{1}{1 + v_{sat,p}\left(\cfrac{1}{v_{sat,n}} - \cfrac{qN_D}{J_{sat,n}}\right)} \qquad [\text{Equation 81}]$$

with respect to an electron saturation velocity $v_{sat,n}$ and a hole saturation velocity $v_{sat,p}$, as well as a saturation current density of the trench MOS gate $J_{sat,n}$ and the doping concentration of the drift region $N_D$.

16. The semiconductor device according to claim 15, wherein a current gain $\alpha_{PNP}$ is greater than, $$1 - \cfrac{1}{1 + \cfrac{v_{sat,p}}{v_{sat,n}}} \qquad [\text{Equation 81B}]$$

with respect to an electron saturation velocity $v_{sat,n}$ and a hole saturation velocity $v_{sat,p}$.

17. The semiconductor device according to claim 15, the saturation current density of the trench MOS gate $J_{sat,n}$ is represented as, $$J_{sat,n} = \left(\frac{\mu_n C_{ox}}{2L_{CH}}\right)(V_G - V_T)^2 f_A \qquad [\text{Equation 8C}]$$

wherein $\mu_n$ is a electron mobility in an inversion layer channel, $C_{ox}$ is a capacitance of the MOS gate, $L_{CH}$ is the inversion layer channel width, $V_G$ is the gate voltage, $V_T$ is the gate threshold, and $f_A$ is a number of unit cells, including one inversion layer channel, per 1 cm², wherein $f_A$ is 5E7 or less.

18. The semiconductor device according to claim 15, wherein a distance between the first peak and the lower surface of the semiconductor substrate is 3 μm or less.

19. A semiconductor device comprising:
a semiconductor substrate;
a drift region having a first conductivity type formed in the semiconductor substrate;
a collector region having a second conductivity type, in the semiconductor substrate, formed between a lower surface of the semiconductor substrate and the drift region; and
a high concentration region having the first conductivity type, in the semiconductor substrate, formed between the drift region and the collector region and having a higher doping concentration than that in the drift region; and
a MOS gate, wherein a doping concentration distribution of the high concentration region in a depth direction of the semiconductor substrate comprises one or more peaks, and wherein a donor doping concentration of the drift region is larger than a value multiplying a saturation current density of electrons injected from the MOS gate by $1.7857 \times 10^{11}$, the saturation current density being represented as, $$J_{sat,n} = \left(\frac{\mu_n C_{ox}}{2L_{CH}}\right)(V_G - V_T)^2 f_A$$

where $\mu_n$ is an electron mobility in an inversion layer channel, $C_{ox}$ is a capacitance of the MOS gate, $L_{CH}$ is an inversion layer channel width, $V_G$ is a gate voltage, $V_T$ is a gate threshold, and $f_A$ is the number of unit cells, including one inversion layer channel, per 1 cm².

* * * * *